United States Patent [19]

Stirling

[11] 4,425,552
[45] Jan. 10, 1984

[54] DIRECT-TYPE BINARY FREQUENCY SYNTHESIZER

[75] Inventor: Ronald C. Stirling, Clearwater, Fla.

[73] Assignee: Sperry Corporation, New York, N.Y.

[21] Appl. No.: 291,204

[22] Filed: Aug. 17, 1981

Related U.S. Application Data

[63] Continuation of Ser. No. 88,973, Oct. 29, 1979.

[51] Int. Cl.$^3$ ............................................. H03B 21/02
[52] U.S. Cl. ........................................ 331/39; 331/40
[58] Field of Search .................................. 331/37–40; 328/14–15

[56] References Cited

U.S. PATENT DOCUMENTS

| | | | |
|---|---|---|---|
| 3,017,579 | 1/1962 | Brack | 331/40 |
| 3,372,347 | 3/1968 | Jones et al. | 331/39 |
| 3,906,388 | 9/1975 | Jones et al. | 331/39 |

*Primary Examiner*—Siegfried H. Grimm
*Assistant Examiner*—Edward P. Westin

[57] ABSTRACT

An apparatus including means for providing at least five fixed internal frequency signals having five different values of frequencies in which all of said frequencies are coupled into a first processor stage comprised of a single pole double throw switch controlled by a first input bit command signal for selecting either of two of said five frequencies for coupling into a first frequency mixer. A third frequency signal is also coupled into the first frequency mixer which provides a first difference frequency output signal that is coupled into a second frequency mixer. The second frequency mixer is coupled to a second single pole double throw switch controlled by a second input bit command signal for selecting either of the fourth or the fifth of said five frequencies. The difference output signal of the second frequency mixer is coupled to a frequency divider capable of division by four. The output signal produced by the frequency divider is a discrete synthesizer frequency output signal selected from a range of frequency output signals in accordance with the input bit command signal. Additional identical processor stages may be added to provide smaller increments between the selectable discrete synthesizer frequency output signals.

2 Claims, 2 Drawing Figures

1

DIRECT-TYPE BINARY FREQUENCY SYNTHESIZER

This application is a continuation of application Ser. No. 88,973, filed Oct. 29, 1979.

BACKGROUND OF THE INVENTION

1. Field of the Invention

The invention relates to the field of signal generators and particularly to signal generators which provide selectable stable frequency output signals produced by performing arithmetic operations, i.e. addition, subtraction, multiplication and division directly upon the frequency signals generated by a frequency standard such as a crystal oscillator. Such signal generators are known as direct type frequency synthesizers.

2. Description of the Prior Art

The invention described herein discloses an improved direct type frequency synthesizer incorporating frequency dividers which can be used to synthesize the microwave frequencies. This disclosure describes improvements for a direct type binary frequency synthesizer which was disclosed in U.S. Pat. No. 3,906,388, granted Sept. 16, 1975, to Jones et al. and assigned to the assignee of the present invention.

The invention disclosed in U.S. Pat. No. 3,906,388 includes a means for providing at least four fixed internal frequency signals having four different values of frequency in which all said frequencies are coupled into a first processor stage comprised of a single pole double throw switch controlled by a first input bit command signal for selecting either of two of said four frequencies for coupling into a first frequency mixer. A third frequency signal is also coupled into the first frequency mixer which provides a first difference frequency output signal that is coupled into a binary frequency divider. The divider output signal is then coupled along with a fourth frequency signal into a second frequency mixer which produces a second difference frequency output signal that is coupled into a third mixer in an output stage which also includes a second signal pole double throw switch controlled by a second input bit command signal for selecting either of the same two of the four frequency signals to also be coupled into the third frequency mixer. The output signal produced by the third mixer is a discrete synthesizer frequency output signal selected from a range of frequency output signals in accordance with the input bit command signal. Additional identical processor stages may be added to provide smaller increments between the selectable discrete synthesizer frequency output signals.

The improved direct binary frequency synthesizer described herein is capable of accomplishing the same functions with fewer components, i.e., the elimination of the final output difference stage and the use of a simplified processor means. Furthermore, the present invention facilitates the addition of common subassemblies of processor means which can each increase the number of discrete frequencies by a factor of four and can decrease the minimum separation between frequencies by a factor of four.

SUMMARY OF THE INVENTION

The apparatus includes means for providing at least five internal, synchronized frequency signals $F_1$, $F_2$, $F_3$, $F_4$ and $F_5$. There are a plurality of serially connected identical processor stages in which each stage comprises the serial combination of a single pole double throw switch, a first rf mixer, a second rf mixer, a second single pole double throw switch, and a frequency divider capable of division by four.

The first frequency signal $F_1$ is coupled to a first input terminal on the first switch and the second frequency signal $F_2$ is coupled to the second input terminal on the first switch. A source of binary bit command signals is also coupled to each switch and controls the selection of $F_1$ or $F_2$ to be coupled to a first input terminal on the first mixer of each stage. The third frequency signal $F_3$ is coupled to a second input terminal on the first mixer in the first stage. The first mixer in each stage produces a difference output signal that is coupled to the second mixer. The second mixer is coupled to the second switch which has first and second input terminals. The fourth frequency signal $F_4$ is coupled to the first input terminal of the second switch and the fifth frequency signal $F_5$ is coupled to the second input terminal on the second switch. A source of binary bit command signals is also coupled to each second switch and controls the selection of either $F_4$ or $F_5$ to be coupled to the second input terminal on the second mixer of each stage. The difference output signal produced by the second mixer is coupled into a frequency divider capable of division by four which may be a digital divider and the output of the frequency divider is the output of the first processor stage. The second processor stage and all subsequent processor stages are identical to the first processor stage except that the output from the preceding processor stage is coupled into the second input terminal of the first mixer in the subsequent processor stage. The output signal from the frequency divider in the final processor stage is the desired synthesized frequency output signal.

In a three stage direct type binary frequency synthesizer the desired output signal may have 64 different values selectable in accordance with the binary bit command signals applied to each of the single pole double throw switches in each stage. The frequency increment between each of the 64 possible values is determined by the frequency values of the five internal frequencies, $F_1$, $F_2$, $F_3$, $F_4$, and $F_5$, and the number of processor stages. The number of frequency signal increments may be increased by a factor of four and the frequency signal separation between increments may be decreased by a factor of four by the insertion of an additional stage.

DISCLOSURE OF THE PREFERRED EMBODIMENT

Figure 1:
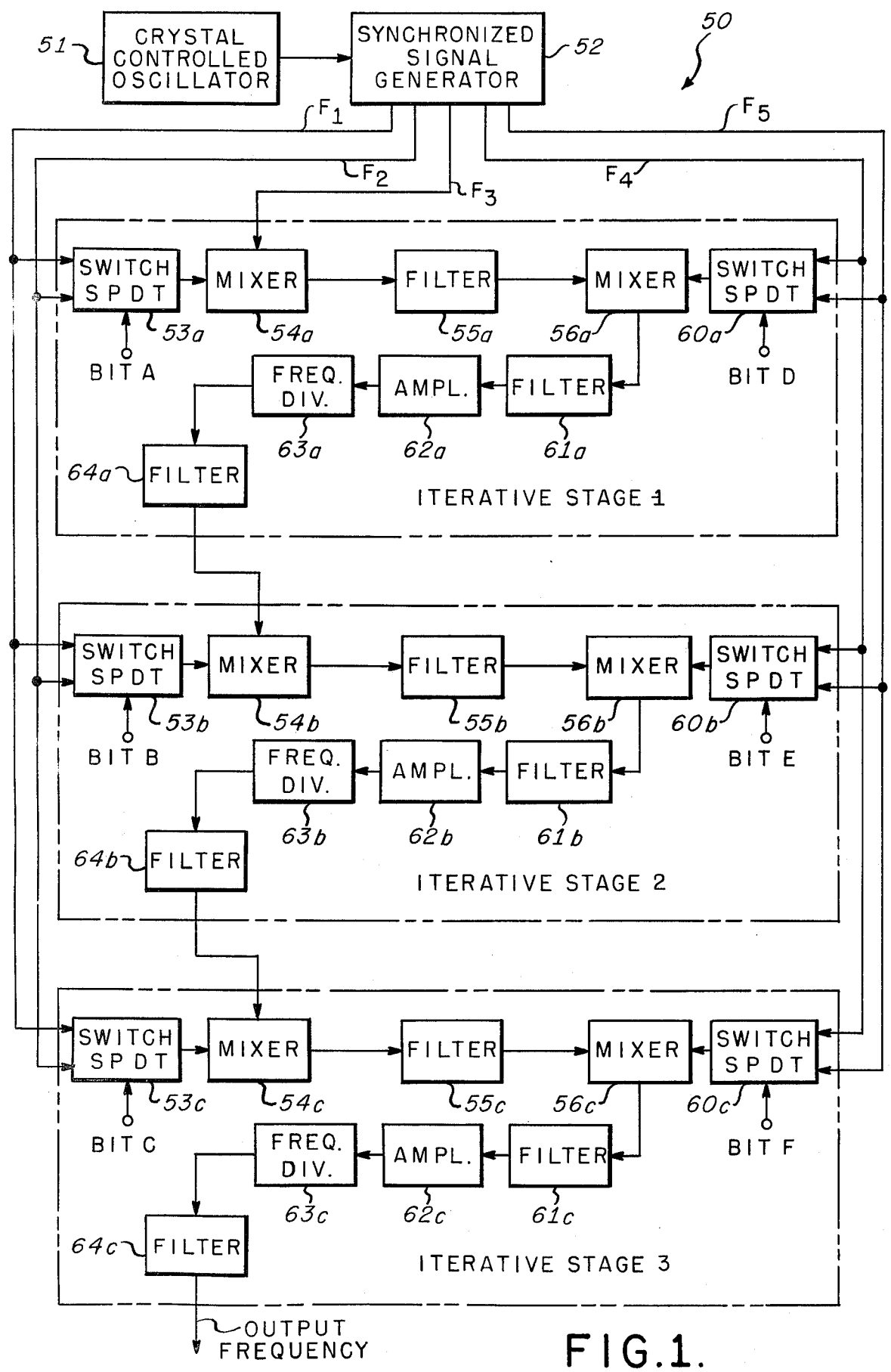
FIG. 1 is a block diagram of an improved direct type frequency synthesizer incorporating a combination of elements in the subject invention.

As shown in FIG. 1, an improved direct type binary frequency synthesizer 50 includes means for providing at least five synchronized internally generated frequency signals, $F_1$, $F_2$, $F_3$, $F_4$ and $F_5$ which may be produced by a crystal control oscillator 51 coupled to an appropriate synchronized signal generator 52. The frequency signals $F_1$ and $F_2$ are coupled into the first single pole double throw switch 53a in iterative processor stage 1. The binary command signal, bit A, produced by a source of command signals (not shown) is also coupled into switch 53a to select either the frequency signal $F_1$ or $F_2$ to be coupled into a first input terminal on a mixer 54a. The second input terminal on the mixer 54a is coupled to the synchronized signal generator 52 to receive the frequency signal $F_3$. The mixer 54a produces sum and difference output frequency signals proportional to the sum and difference respectively of the frequencies $F_1 \pm F_3$ or $F_2 \pm F_3$ as determined by bit A.

The difference frequency output signal produced by the mixer 54a is coupled into a band pass filter 55a tuned to the pass band of the range difference frequencies for the mixer 54a input values. The filtered difference frequency output signal is coupled to an input terminal of the second mixer 56a. A second input terminal of the second mixer 56a is coupled to the output of the second single pole double throw switch 60a. Frequency signals $F_4$ and $F_5$ are coupled to the input terminal of the single pole double throw switch 60a, and binary command signal, bit D, produced by the source of command signals is coupled to switch 60a to select either the frequency signal $F_4$ or $F_5$. The difference frequency output signal produced by the mixer 56a is coupled into a band pass filter 61a tuned to the pass band of the range of difference frequency signals for the mixer 56a input values. The filtered difference frequency output signal of filter 61a is coupled to the input of rf amplifier 62a which increases the power level of the difference frequency signal to a value suitable for driving a frequency divider 63a which divides the amplified difference frequency signal by four. The divided difference frequency signal is coupled to the input terminal on a band pass filter 64a, and the output of the band pass filter 64a is the output of iterative processor stage 1.

The output signal of processor stage 1 is coupled to the input terminal of mixer 54b which is located in iterative stage 2. The remaining operations in iterative stage 2 are identical to iterative stage 1, and operations in iterative stage 3 are likewise identical to iterative stage 1. The only difference between iterative stages 2 and 3 is that the respective single pole double throw switches 53b and 53c are controlled by bits B and C respectively and the respective single pole double throw switches 60b and 60c are controlled by bits E and F respectively. The output frequency signal provided at the output terminal of the filter 64c is the selected output frequency synthesized in accordance with the binary command signal and the specific values of frequency signals $F_1$, $F_2$, $F_3$, $F_4$ and $F_5$.

Figure 2:
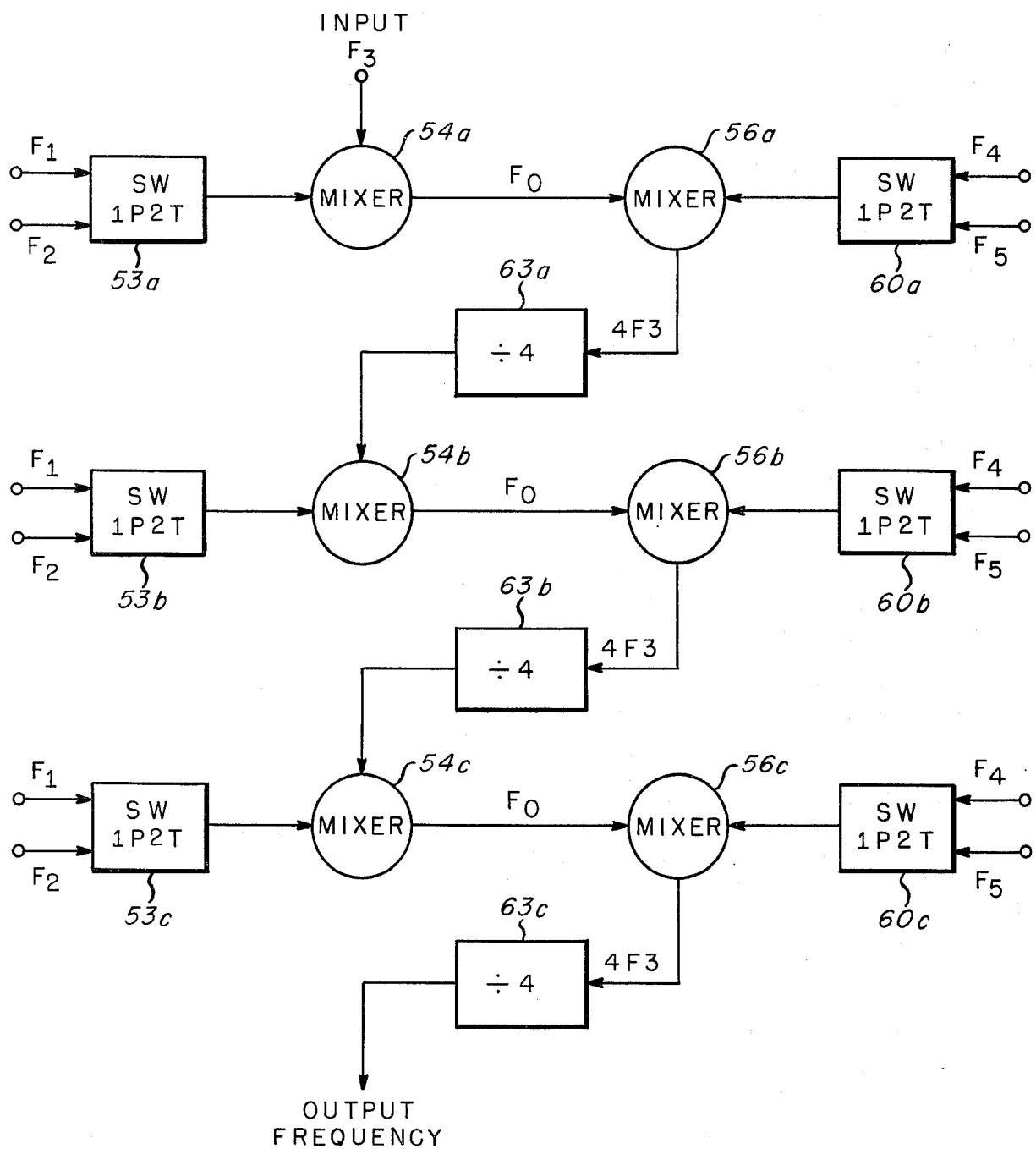
FIG. 2 is a simplified block diagram used to describe the preferred embodiment.

A specific embodiment of the synthesizer shown in FIG. 1 will be described with reference to the simplified block diagram shown in FIG. 2. The filters 55a through 55c, 61a through 61c, and 64a through 64c and the amplifiers 62a through 62c along with the source of synchronized internal frequencies crystal control oscillator 51 and synchronized signal generator 52, have been omitted to simplify the explanation and presentation of the specific embodiment. As shown in FIG. 2, signals of frequencies $F_1$ and $F_2$ are selectively coupled to the mixers 54a through 54c via the single pole double throw switches 53a through 53c respectively, and frequency signal $F_4$ and $F_5$ are selectively coupled to the mixers 56a through 56c via the single pole double throw switches 60a through 60c respectively. The binary bit command signals designated A, B and C control the switches 53a through 53c to select either signals of frequency $F_1$ or $F_2$ and binary bit command signals designated D, E and F control switches 60a through 60c to select either frequency signal $F_4$ or $F_5$. The selected frequency signals are then coupled to the first input terminals on associated mixers 54a through 54c and 56a through 56c.

The first iterative processor stage can synthesize four possible frequency signals $$\frac{(F_1 - F_3 - F_4)}{4}, \frac{(F_1 - F_3 - F_5)}{4}, \frac{(F_2 - F_3 - F_4)}{4} \text{ or}$$

$$\frac{(F_2 - F_3 - F_5)}{4}.$$

The frequency signals synthesized depend upon which switches 53a through 53c and 60a through 60c are selected by the binary bit command signal. The output frequency signal of iterative stage 1 must be represented by one of the four equations listed above. When a second iterative processor stage is added, four possible output frequency signals of the first stage provide four possible input frequency signals for the second stage. The second processor stage is capable of synthesizing four output frequency signals from each of the four possible input frequency signals for a total of 16 possible output frequency signals. Each additional processor stage is likewise capable of synthesizing a number of output frequency signals that is four times greater than the number of input frequency signals to that stage.

The following table displays a representative sample of the output frequency signals which can be synthesized with a three stage processor.

| (BIT) F | C | E | B | D | A | Output Frequency |
|---|---|---|---|---|---|---|
| 0 | 0 | 0 | 0 | 0 | 0 | $F_3$ |
| 0 | 0 | 0 | 0 | 0 | 1 | $F_3 + F_s/64$ |
| 0 | 0 | 0 | 0 | 1 | 0 | $F_3 + F_s/32$ |
| 0 | 0 | 0 | 0 | 1 | 1 | $F_3 + 3F_s/64$ |
| 0 | 0 | 0 | 1 | 0 | 0 | $F_3 + F_s/16$ |
| . | . | . | . | . | . | ...... |
| . | . | . | . | . | . | ...... |
| 1 | 1 | 1 | 1 | 1 | 1 | $F_3 + \frac{63F_s}{64}$ |

As shown in FIG. 2 when switches 53a through 53c select signal $F_1$ and switches 60a through 60c select signal $F_4$, the input to each processor stage will be signal $F_3$ and the output of each processor stage will also be signal $F_3$. This condition will occur when the binary command signal contains a string of zeros. It should be noted that the five signals provided by signal generator 52 are related in the following manner:

$$F_0 = F_1 - F_3, \quad F_4 = F_0 + 4F_3,$$
$$F_1 - F_2 = F_s, \text{ and } F_5 - F_4 = 2F_s$$

where $F_s$ is the desired signal frequency to be incremented and $F_0$ is a frequency component of the signal coupled from the first mixer to the second mixer in each stage, e.g., the frequency signal coupled to the second mixer in each stage is $F_0 - aF_s$ where $1 > a \geq 0$ and is functionally dependent upon the binary command signal and the stage of the processor.

The frequency signal $F_3$, therefore, can be incremented in a binary fashion, i.e., $F_3 + F_s/64$, $F_3 + F_s/32$, etc. by the binary bit command signals that feed into switches 53a through 53c and switches 60a through 60c. As the occurrence of ones in the binary command signal increases, the frequency of the signal $F_3$ is increased by increments of $DF_s/64$, where D is the decimal equivalent of the binary command signal.

For example, let switch $53a$ select signal $F_2$, let switches $53b$ and $53c$ select signal $F_1$, and let switches $60a$ through $60c$ select signal $F_4$. The binary command signal, therefore, is 0 0 0 0 0 1. The input signals to mixer $54a$ are signals $F_2$ and $F_3$ and the output signal is $F_2-F_3$ or by substitution of the equations from above, i.e., $F_0=F_1-F_3$ and $F_s=F_1-F_2$, the output signal of mixer $54a$ is $F_0-F_s$. The output signal of mixer $54a$ and the signal $F_4$ selected by switch $60a$ are applied to the mixer $56a$. The output signal of mixer $56a$ is $4F_3+F_s$. This output signal is then applied to the frequency divider $63a$ and produces an output signal of $F_3+F_s/4$ which is also the output signal of the first iterative processor stage. The output signal of the first iterative processor stage and the signal $F_1$ selected by switch $53b$ are applied to the mixer $54b$. The output signal of mixer $54b$ is $F_0-(F_s/4)$. The output signal of mixer $54b$ and the signal $F_4$ selected by switch $60b$ are applied to mixer $56b$. The signal output of mixer $56b$ is $4F_3+(F_s/4)$. The output signal of mixer $56b$ is applied to the frequency divider $63b$ and produces an output signal of $F_3+(F_s)/16$. The output signal of the frequency divider $63b$ is the output signal of the second iterative processor stage. The output signal of the second iterative processor stage and the signal $F_1$ selected by switch $53c$ are applied to mixer $54c$. The output signal of mixer $54c$ is $F_0-(F_s)/16$. The output signal of mixer $54c$ and the signal $F_4$ selected by the switch $60c$ are applied to mixer $56c$. The output signal of mixer $56c$ is $4F_3+(F_s)/16$. The output signal of mixer $56c$ is applied to the frequency divider $63c$ and produces an output signal of $F_3+(F_s)/64$. The output signal of frequency divider $63c$ is the output signal of the final iterative processor stage and the desired synthesized frequency.

As can be seen from the example above, the input signal is incremented as a function of the switch positions and the number of frequency dividers between the input signal and the final output signal. In the example above, the selection of $F_2$ in place of $F_1$ causes the output signal of mixer $54a$ to be offset by a value equal to $F_s$ which then passes through three frequency dividers capable of division by four before reaching the final output stage. This final output results in an offset of the value $(F_s/4^3)$. The synthesized output signals, therefore, result in a progression of sum values having a first component equal to $F_3$ and a second component equal to a fractional offset of $F_s$.

For N processor stages, a general formula exists relating the binary bit command signals to the frequency of the output signal: an ordered pair is formed, for each of the processor stages, whose right entry is the frequency of the output of the switch having inputs with frequencies $F_1$ and $F_2$, and whose left entry is the frequency of the output of the switch having inputs with frequencies $F_4$ and $F_5$. The ordered pairs of consecutively increasingly numbered processor stages are concatenated from right to left, forming a sequence of frequencies. In the sequence so formed, the frequencies are replaced by their corresponding binary bit command signals, that is, $F_1$ is replaced by 0, $F_2$ is replaced by 1, $F_4$ is replaced by 0, and $F_5$ is replaced by 1. A base 2 (binary) number results whose base ten (decimal) equivalent is denoted by "D". Binary bit command inputs which give rise, as indicated above, to this number "D" generate an output whose frequency is given by $F_3+(D/4^N) F_S$, where, as noted above, N is the number of processor stages and $F_S=F_1-F_2=(F_5-F_4)/2$.

This formula may be proven by induction. For one stage, $N=1$, only one ordered pair of switch output frequencies is involved. If the switch whose inputs have frequencies $F_1$ and $F_2$ has an output with frequency $F_1$, and if the switch whose inputs have frequencies $F_4$ and $F_5$ has an output with frequency $F_4$, then the ordered pair referred to above is $F_4 F_1$. Replacing $F_4$ by 0, and $F_1$ by 0, provides a base 2 number 00 which in base ten is 0. The formula predicts an output having frequency $F_3+(0/4) F_S=F_3$. Actually calculating provides an output having frequency $(F_1-F_3-F_4)/4$. But, as indicated above, $F_1-F_3=F_0$, and $F_4=F_0+4F_3$. Substituting, the output frequency is $(F_0-F_0-4F_3)/4=-F_3$. In the context of the invention, in view of the operation of a mixer, negative signs in calculated output frequencies may be ignored, since frequencies must clearly be positive. Thus, the calculated frequency corresponds to that predicted by the formula.

For the ordered pair $F_5 F_1$, the base 2 number is 10, which is equivalent to 2 in base ten. The predicted output frequency is $F_3+(2/4) F_S=F_3+(\frac{1}{2}) F_S$. Actually calculating provides an output frequency $(F_1-F_3-F_5)/4$. Since $F_4=F_0+4F_3$ and $F_5-F_4=2F_S$, adding both equations gives $F_5=F_0+4F_3+2F_S$. Substituting $F_0$ for $F_1-F_3$, and $F_0+4F_3+2F_S$ for $F_5$, provides $(F_0-F_0-4F_3-2F_S)/4=-F_3-F_S/2$ which, ignoring negative signs, corresponds to the predicted value.

For the ordered pair $F_4 F_2$, the base 2 number is 01, which is equivalent to 1 in base ten. The formula predicts an output frequency of $F_3+(\frac{1}{4}) F_S$. Actually calculating provides an output frequency $(F_2-F_3-F_4)/4$. Since $F_0=F_1-F_3$, and $F_S=F_1-F_2$, $F_2-F_3=F_0-F_S$. Substituting for $F_2-F_3$, and $F_4$ provides $(F_0-F_S-F_0-4F_3)/4=(-F_S-4F_3)/4=-F_3-F_S/4$ which is equivalent to the predicted value.

For the ordered pair $F_5 F_2$, the base 2 number is 11, which is equivalent to 3 in base ten. The formula predicts an output frequency of $F_3+(\frac{3}{4}) F_S$. Actually calculating provides an output frequency of $(F_2-F_3-F_5)/4$. Substituting $F_0-F_S$ for $F_2-F_3$ and $F_0+4F_3+2F_S$ for $F_5$ provides $(F_0-F_S-F_0-4F_3-2F_S)/4=(-4F_3-3F_S)/4=-F_3-(\frac{3}{4}) F_S$ which is equivalent to the predicted value. Thus, the formula is correct for the case $N=1$. By the method of proof by induction, the formula is assumed true for $N=K$, and it is shown true for the case $N=K+1$. In the $K+1$ stage, if the output frequency of the switch whose inputs have frequencies $F_1$ and $F_2$ is $F_1$, and if the output frequency of the switch whose inputs have frequencies $F_4$ and $F_5$ is $F_4$, then the ordered pair associated with this stage is $F_4 F_1$. Substituting 0 for $F_1$ and 0 for $F_4$ provides a binary number 00. By assumption, the output frequency of stage K is $F_3+(D/4^K) F_S$ where D is the base ten equivalent of a base 2 number, say B, formed by concatenating from right to left the ordered pairs of frequencies of consecutively increasingly numbered stages and replacing within the sequence so formed $F_1$ by 0, $F_2$ by 1, $F_4$ by 0 and $F_5$ by 1. Accordingly, the binary number associated with the $K+1$ stages is the binary number B with 00 concatenated on its left, denoted 00 B. This number is, of course, just B. The base ten number equivalent to B is by assumption D. Thus, the formula predicts an output frequency of $F_3+(D/4^{K+1}) F_S$. Actually calculating provides an output having frequency $(F_1-(F_3+(D/4^K) F_S)-F_4)/4$, since by assumption $F_3+(D/4^K) F_S$ is the output of stage k. The expression equals $(F_1-F_3-(D/4^K) F_S-F_4)/4$, which upon substituting $F_0$ for $F_1-F_3$ and $F_0+4F_3$ for $F_4$ becomes $(F_0-(D/4^K) F_S-F_0-4F_3)/4 = -F_3-(D/4^{K+1}) F_S$, which is equivalent to the predicted value.

In the K+1 stage, if the switch whose inputs have frequencies $F_1$ and $F_2$ has an output frequency $F_1$, and if the switch whose inputs have frequencies $F_4$ and $F_5$ has an output frequency $F_5$, then the ordered pair associated with the K+1 stage is $F_5F_1$, which provides a base 2 number 10. The base 2 number associated with all K+1 stages is then 10 concatenated on the left of the base 2 number B, denoted 10 B. The last two bits of the binary number 10 B occupy, respectively, the 2(K+1) and 2K+1 positions in the number, since the number is formed by concatenating K+1 ordered pairs, and 10 is the last such ordered pair. Accordingly, the ordered pair 10 concatenated on the left of B represents, in base ten, a value of $2^{2(K+1)-1} = 2^{2K+1} = 2(4^K)$. Since D is the base ten equivalent of the base 2 number B, the base ten equivalent of 10 B is $2(4^K)+D$. The formula, therefore, predicts an output frequency of $F_3+((2(4^K)+D)/4^{K+1})F_S = F_3+(\frac{1}{2})F_S+(D/4^{K+1})F_S$. Actually calculating provides an output frequency $(F_1-(F_3+(D/4^K)F_S)-F_5)/4 = (F_1-F_3-(D/4^K)F_S-F_5)/4$. Substituting $F_0$ for $F_1-F_3$, and $F_0+4F_3+2F_S$ for $F_5$ provides $(F_0-(D/4^K)F_S-F_0-4F_3-2F_S)/4 = -F_3-F_S/2-(D/4^{K+1})F_S$, which is equivalent to the predicted value.

In the K+1 stage, if the switch whose inputs have frequencies $F_1$ and $F_2$ has an output frequency $F_2$, and if the switch whose inputs have frequencies $F_4$ and $F_5$ has an output frequency $F_4$, then the ordered pair associated with the K+1 stage is $F_4F_2$, which provides a base 2 number 01. Concatenating 01 to B provides 01 B which has a base ten value of $2^{2K}+D = 4^K+D$. Accordingly, the formula predicts an output frequency $F_3+((4^K+D)/4^{K+1})F_S = F_3+(\frac{1}{4})F_S+(D/4^{K+1})F_S$. Actually calcuating provides an output frequency $(F_2-(F_3+(D/4^K)F_S)-F_4)/4 = (F_2-F_3-(D/4^K)F_S-F_4)/4$. Substituting $F_0-F_S$ for $F_2-F_3$ and $F_0+4F_3$ for $F_4$ provides $(F_0-F_S-(D/4^K)F_S-F_0-4F_3)/4 = -F_3-(\frac{1}{4})F_S-(D/4^{K+1})F_S$, which is equivalent to the predicted value.

In the K+1 stage, if the switch whose inputs have frequencies $F_1$ and $F_2$ has an output frequency $F_2$, and if the switch whose inputs have frequencies $F_4$ and $F_5$ has an output frequency $F_5$, then the ordered pair associated with the K+1 stage is $F_5F_2$, which provides a base 2 number of 11. Concatenating 11 to B provides 11 B which has a base ten value of $2^{2K+1}+2^{2K}+D = 2(4^K)+4^K+D$. Accordingly, the formula predicts an output frequency of $F_3+((2(4^K)+4^K+D)/4^{K+1})F_S = F_3+(\frac{1}{2})F_S+(\frac{1}{4})F_S+(D/4^{K+1})F_S$. Actually calculating provides an output frequency $(F_2-(F_3+(D/4^K)F_S)-F_5)/4 = (F_2-F_3-(D/4^K)F_S-F_5)/4$. Substituting $F_0-F_S$ for $F_2-F_3$ and $F_0+4F_3+2F_S$ for $F_5$ provides $(F_0-F_S-(D/4^K)F_S-F_0-4F_3-2F_S)/4 = -F_3-(\frac{1}{4})F_S-(\frac{1}{2})F_S-(D/4^{K+1})F_S$, which is equivalent to the predicted value.

Thus, having shown the formula correct for N=1, and having shown that assuming it is correct for N=K implies that it is correct for N=K+1, the formula has been shown, by induction, to be correct for any value of N.

Accordingly, in summary, the output frequency is given by $F_3+(D/4^N)F_S$, where $F_S = F_1-F_2 = (F_5-F_4)/2$, N=number of processor stages, and D is the base ten number which is equivalent to the base 2 number which results from forming, for each processor stage, an ordered pair whose right entry is the frequency of the output of the switch having input frequencies $F_1$ and $F_2$, and whose left entry is the output frequency of the switch having input frequencies $F_4$ and $F_5$; and, from concatenating from right to left the ordered pairs of consecutively increasingly numbered processor stages; and, from replacing, within the sequence so formed, $F_1$ by 0, $F_2$ by 1, $F_4$ by 0, and $F_5$ by 1.

While the invention has been described in its preferred embodiments, it is to be understood that the words that have been used are words of description rather than limitation and that changes within the purview of the appended claims may be made without departing from the true scope and spirit of the invention in its broader aspects.

I claim:

1. A direct-type binary frequency synthesizer, providing an output signal, comprising:

frequency generator means for providing at least five output signals having, respectively, predetermined frequencies $F_1$, $F_2$, $F_3$, $F_4$, and $F_5$ such that $F_1-F_3 = F_4-4F_3$, and $F_5-F_4 = 2F_1-2F_2$;

binary bit command signal means for providing binary bit command signals;

at least one processor stage, a processor stage providing an output signal, and having:

first switch means, coupled to said frequency generator means and said binary bit command signal means, for receiving said binary bit command signals and said signals having frequencies $F_1$ and $F_2$, and for selectively providing, in response to said binary bit command signals, an output signal of either said signal having frequency $F_1$ or said signal having frequency $F_2$;

first mixer means, responsive to said output signal of said first switch means, and a second input signal, for providing an output signal having a frequency which is the frequency difference between said output signal of said first switch means and said second input signal;

second switch means, coupled to said frequency generator means and said binary bit command signal means, for receiving said binary bit command signals and said signals having frequencies $F_4$ and $F_5$, and for selectively providing, in response to said binary bit command signals, an output signal of either said signal having frequency $F_4$ or said signal having frequency $F_5$;

second mixer means, responsive to said output signal of said second switch means and said output signal of said first mixer means, for providing an output signal having a frequency which is the frequency difference between said output signal of said first mixer means and said output signal of said second switch means; and divider means, responsive to said output signal of said second mixer means, for providing an output signal having a frequency which is one-quarter of the frequency of said output signal of said second mixer means, said output signal of said divider means being said output signal of said processor stage, a first processor stage of said at least one processor stage having said signal with frequency $F_3$ provided by said frequency generator means as said second input signal to which said first mixer means is responsive, each additional processor stage of said at least one processor stage being consecutively numbered, and having the output signal of the preceding processor stage as said second input signal to which said first mixer means is responsive, the output of the highest numbered processor stage being said output of said frequency synthesizer, whereby the frequency of said output signal of said frequency synthesizer is $F_3 + (D/4^N) F_S$, where $F_S$ is $(F_5 - F_4)/2$, N is the number of processor stages, and D is the base 10 number which is equivalent to the base 2 number which results from forming, for each processor stage, an ordered pair whose right entry is the frequency of the output signal of said first switch means, and whose left entry is the frequency of the output signal of said second switch means; and, from concatenating from right to left the ordered pairs of consecutively, increasingly numbered processor stages; and, from replacing, within the sequence so formed, $F_1$ by 0, $F_2$ by 1, $F_4$ by 0, and $F_5$ by 1.

2. An apparatus as in claim 1 wherein:

said frequency generator means comprises a crystal controlled oscillator, and a synchronized signal generator coupled to said oscillator, said first switch means comprises a first single pole double throw switch, said first mixer means comprises:
 a first mixer, coupled to said first switch; and
 a first band pass filter, coupled to said first mixer, tuned to the pass band of the frequency difference between an output signal of said first switch and said second input signal, said second switch means comprises a second single pole double throw switch, said second mixer means comprises:
 a second mixer, coupled between said second switch and said first filter;
 a second band pass filter, coupled to said second mixer, tuned to the pass band of the frequency difference between an output signal of said second switch and an output signal of said first filter; and
 an amplifier, coupled to said second filter, and said divider means comprises a digital divider, coupled to said amplifier.

* * * * *